United States Patent [19]

Wong et al.

[11] Patent Number: 5,432,736
[45] Date of Patent: Jul. 11, 1995

[54] BICMOS MEMORY CELL WITH CURRENT ACCESS

[75] Inventors: Ban P. Wong, Milpitas; John G. Campbell, Los Altos, both of Calif.

[73] Assignee: MicroUnity Systems Engineering, Inc., Sunnyvale, Calif.

[21] Appl. No.: 184,436

[22] Filed: Jan. 21, 1994

[51] Int. Cl.$^6$ .................... G11C 7/00; G11C 11/40
[52] U.S. Cl. ..................... 365/177; 365/154;
    365/156; 365/189.11; 365/190; 365/207
[58] Field of Search ............ 365/177, 154, 230.05,
    365/190, 205, 207, 189.11, 156

[56] References Cited

U.S. PATENT DOCUMENTS

| 4,933,899 | 6/1990 | Gibbs | 365/177 |
| 5,239,501 | 8/1993 | Matsui et al. | 365/177 X |
| 5,283,757 | 2/1994 | Lee et al. | 365/177 |

OTHER PUBLICATIONS

Wingard et al., "Circuit Techniques for Large CSEA SRAM's", IEEE Journal of Solid-State Circuits, vol. 27, No. 6 (Jun. 1992).

Primary Examiner—Do Hyun Yoo
Attorney, Agent, or Firm—Burns, Doane, Swecker & Mathis

[57] ABSTRACT

A current mode access BiCMOS memory cell is disclosed. The memory cell includes a CMOS storage cell for storing first and second CMOS voltage potentials, VDD and VSS, corresponding to first and second logic levels. The storage cell includes two CMOS inverters coupled between VDD and VSS. The storage cell is coupled to a conversion circuit. The conversion circuit is coupled between third and fourth ECL working potentials. It functions to convert the first and second CMOS voltage potentials into the third and fourth working potentials. The third and fourth voltage potentials are coupled to the bases of two bipolar signal converters. The emitters of the bipolar signal converters are coupled to a selectable current source and the collectors of the bipolar signal converters are coupled to complementary bit lines. The selectable current source is responsive to a read word signal. A differential current signal representing the data stored in the memory cell is established in the complementary bit lines when the current source is selected and current is allowed to flow through one of the bipolar signal converters. The third and fourth ECL voltage potentials are chosen such that they ensure that the bipolar signal converters are not driven into saturation. In this way, read times are optimized. In addition, read times are reduced since peak-to-peak voltage of the current mode differential signal established across the complementary bit lines are reduced.

12 Claims, 4 Drawing Sheets

BICMOS MEMORY CELL WITH CURRENT ACCESS

FIELD OF THE INVENTION

The present invention relates to the field of memory cells, and specifically to bipolar complementary metal oxide silicon (BiCMOS) memory cells.

BACKGROUND OF THE INVENTION

In the advent of bipolar complementary metal-oxide-silicon (BiCMOS) technology many circuit designs have been converted to include both bipolar transistors and complementary metal-oxide-silicon (CMOS) devices. In this way, circuit designers can take advantage of the speed of emitter-coupled logic circuits (ECL) and the small size and low power consumption properties of CMOS storage elements.

ECL memory cells are typically very fast and CMOS memory cells are typically low power and small. Consequently, it is desirable to combine both of these properties by designing a BiCMOS memory cell. This is particularly true as memory capacity increases. However, although there are many memory cell designs made-up of solely ECL or CMOS devices, there are few BiCMOS memory cell designs available.

One prior art BiCMOS memory cell design disclosed by Drew Wingard, et al. entitled "Circuit Techniques for Large CSEA SRAM's" in the IEEE Journal of Solid State Circuits, Vol 27, no. 6, June 1992, is shown in FIG. 1. Referring to FIG. 1, the memory cell is shown in typical array configuration including rows and columns of memory cells, i.e. C11, C12, C13, and C21. C11 shows the memory cell in detail. It should be noted that the write circuitry for C11 has been omitted so as to simplify explanation of the memory cell.

As can be seen, each memory cell includes a CMOS storage portion comprising two CMOS inverters connected such that the input of each inverter is coupled to the output of the other. MOS devices P1 and N1 comprise the first inverter and P2 and N2 the other inverter. The inverters are coupled between two voltage potentials, VSS and RWL1, (referred to as the read word (RW) line). The first voltage potential, VSS, is fixed at approximately zero volts, i.e. ground. The second potential, RWL1 is a variable potential line. This RW line is driven between a logic high voltage potential, approximately $(VDD - VD_{DIODE\ DROP})$, and a low voltage potential, approximately $(VDD - 2 \times V_{DIODE\ DROP})$. The output of the CMOS storage cell, node 30, (also referred to as the storage node of the cell) is taken at the output of one of the inverters.

The base-emitter junction of npn bipolar transistor Q11 is coupled between node 30 and bit line BL1. Q11 functions to transfer the data stored in the cell to the bit line. To transfer data from the cell to the bit line, the RW line is driven to a voltage potential corresponding to a high logic level. Since Q11 is an emitter follower, the binary data on its base is seen at its emitter, and consequently on BL1.

As can be seen in FIG. 1, a memory array comprising the BiCMOS memory cell described above has many rows and columns of BiCMOS storage cells. All of the transfer devices in the same column have their emitters coupled to the same bit line. Referring to FIG. 1 the emitters of Q11, Q12, and Q13 are coupled to BL1. All of the same storage cells in a particular row are connected between the same RW line and ground, i.e. C11 and C21 are both coupled between RWL1 and VSS.

The array functions such that only a row, or word, of data is transferred to the bit lines when one of the RW lines is driven high. If the array has N bit lines, an N-bit word is transferred. For the array shown in FIG. 1, two bit lines are shown so the output of the array is a 2-bit word.

Each bit line has its own corresponding sense amplifier which compares the voltage on the bit line, i.e. the data from the cell, to a reference voltage; i.e. sense amplifier 1 corresponds to BL1 and sense amplifier 2 corresponds to BL2. The sense amplifier responds to the voltage on the bit lines and outputs a voltage potential corresponding to that sensed logic state.

One problem with the above described BiCMOS memory cell is related to the speed at which data can be read from it. A finite amount of delay occurs from the time a RW line is driven high to the time a change is sensed on the bit line of a sense amplifier. This read delay time is primarily due to the resistive and capacitive (RC) loading on the RW and bit lines. High RC loading results in slow signal response times. The RC loading of these lines depend on several factors.

One factor is related to the number of memory cells that a RW or bit line is coupled to within the array; the more memory cells that a bit or RW line is coupled to, the more RC loading. In particular, the RC loading presented by the resistance associated with P2 and the capacitance associated with the drain of P2, interconnect wiring, and the base of Q11 add significantly to the delay during read access. Further, since there are many rows and columns within a memory array, the capacitive loading on bit and RW lines is high. Another factor affecting the RC loading is the length of the bit and RW lines; the longer an interconnect line is, the higher its associated line resistance and capacitance. Since bit and RW lines are relatively long, they tend to be high capacitive lines.

The above RC loading factors impact the speed at which the BiCMOS memory cell shown in FIG. 1 can be read. In addition, for a given cell size and current drive, the larger the peak voltage of the signal driving the RW and bit lines the slower read times will be. The prior art memory cell shown in FIG. 1 functions such that single-ended voltages are presented to the sense amplifier. Thus, the voltage swing on the bit lines tend to be relatively large in order to be sensed reliably.

Consequently, although the BiCMOS memory cell described above can be read faster than a complementary metal-oxide-silicon (CMOS) memory cell, it is significantly slower than a fully differential emitter-coupled logic (ECL) memory cell.

Another problem associated with the prior art BiCMOS memory cell shown in FIG. 1 results when low data is being presented to the transfer transistor from the memory cell. Since the CMOS storage cell is coupled between the RW line and ground, when low data is presented to the transfer transistor Q11, its base is at a voltage potential approximately equal to ground. The ground potential on the base of the Q11 is compared to a higher reference voltage on its emitter, (coupled to BL1 through the sense amplifier). With its base at ground and its emitter at a high voltage potential, Q11's base-emitter junction is strongly reverse biased. This reverse biasing has an adverse effect on the beta of the transfer device. Specifically, hot electron injection occurring in the base-emitter junction over a long period of time causes beta degradation. Reduced betas may impact the ability of the transfer device to transfer the correct data from the memory cell to the bit line and can lead to incorrect output data.

One BiCMOS design which avoids this reverse biasing problem is disclosed in U.S. Pat. No. 4,933,899; shown in FIG. 2. In this BiCMOS memory cell design, the base-emitter junction of the bipolar transfer transistor is isolated from the CMOS storage cell portion of the memory cell by a buffer circuit. Referring to FIG. 2, the CMOS storage cell comprising P1, P2, N1 and N2 is coupled between two fixed voltage potentials; a CMOS logic high voltage potential (VDD) and and a CMOS logic low level voltage (VSS), instead of the variable RW line and ground (as seen in FIG. 1). The storage nodes of the CMOS storage cell, nodes 1 and 2 are coupled to a buffer circuit.

The buffer circuit comprises series-coupled PMOS devices P3 and P4 and series-coupled devices P5 and P6. Further, the gates of P4 and P5 are coupled to node 1 and the gates of P3 and P6 are coupled to node 2. Each pair of series-coupled devices are coupled between RWL and a reference voltage (VREF). VREF is greater than ground. In contrast to the BiCMOS memory cell shown in FIG. 1, the bases of transfer device Q11 and Q12 is coupled to the buffer circuit instead of the storage cell. With the memory cell designed in this manner, when a low voltage is sensed, the base of the transfer device is at a voltage approximately equal to VREF, (instead of at ground as in FIG. 1). As a result, the reverse bias voltage on the base-emitter junction of the transfer device in the prior art memory cell shown in FIG. 2 is eliminated. Thus, no beta degradation due to hot electron injection occurs.

The prior art memory cell shown in FIG. 2 reduces the beta degradation problem associated with large reverse biasing on the transfer device. However, this design does not make a significant impact in reducing capacitive related delay times associated with reading the BiCMOS memory cell; particularly, since the RWL is still a variable voltage signal and a delay is still presented by P5 and Q11 (or P3 and Q12), in addition to the capacitance associated with the RW line.

In addition, the prior art memory cell design shown in FIG. 2 is a pseudo-differential memory cell and requires much larger RW and bit line voltage swings in order to be reliably sensed. Since it is a pseudo-differential memory cell, only one of the bit lines supplies the signal while the other provides the cell reference. For example, as shown in FIG. 2, when a read operation is being performed, the voltage potential on BL/ is held at a reference voltage while BL moves in response to the RW line, or BL is held at a reference voltage while BL/ moves, (depending on the state stored in the memory cells). However, it is often desirable to have a differential memory cell design in which the memory cell outputs a signal and the inverse of the given signal, referred to as a fully differential signal. One advantage of a fully differential memory cell is that the swing on the bit lines can be less than half that of the single-ended or pseudo-differential cell.

The present invention is an improved differential BiCMOS memory cell that reduces read delay times by sensing differential current changes, (as opposed to large voltage changes) on high fan-out bit lines. The bit line voltage swing of the present invention is at least an order of magnitude less than that of the any prior art BiCMOS design. Further, the memory cell design of the present invention is enhanced so as to reduce the RC loading commonly seen in prior art memory cells.

SUMMARY OF THE INVENTION

A BiCMOS memory cell having improved read access time is disclosed. In the memory cell of the present invention, the data stored in the memory cell is first converted from CMOS voltage levels to ECL voltage levels. Next, the ECL voltage levels are converted into a differential current signal corresponding to the stored data by a pair of bipolar signal converters. This differential current signal is sensed in complementary bit lines by a current mode sense amplifier. Since the differential current signal has a relatively low peak-to-peak voltage swing, resistive and capacitive loading on long bit lines have a minimal effect on memory read time.

The BiCMOS memory cell includes a CMOS storage cell portion comprising two CMOS inverters each having their inputs coupled to each others outputs. The CMOS inverters are each coupled between a first set of working potentials, VDD and VSS. In one embodiment, VSS is a voltage potential equal to ground and VDD is equal to approximately 5 volts, thus giving the CMOS storage cell portion approximately a 1.5 volt noise margin from ground and a 3.5 volt noise margin from VDD. However, since the VDD and VSS voltages for the storage portion of the BiCMOS memory cell of the present invention does not fluctuate, the storage cell portion is subjected to less noise. Consequently, in another embodiment, VDD is approximately equal to 3 volts and VSS is approximately equal to ground. As a result, the noise margin is equal to approximately 1.20 volts from ground and 1.80 volts from VDD.

The two outputs of the CMOS inverters, i.e. the storage nodes, are coupled to a conversion circuit. The conversion circuit comprises four PMOS devices. It is coupled between a second set of working potentials, VREF(HI) and VREF(LO). It converts the voltage potentials on the storage nodes of the CMOS storage cell, i.e VDD and VSS, to a set of ECL compatible digital logic voltage potentials, i.e. VREF(HI) and VREF(LO). In the preferred embodiment, VREF(HI) is approximately equal to (VDD$-V_{DIODE\ DROP}$) and VREF(LO) is approximately equal to (VDD$-2\times V_{DIODE\ DROP}$). The conversion circuit outputs two complementary digital signals, VREF(HI) and VREF(LO). These complementary digital signals are each coupled to the base of a bipolar signal converters. These ECL level signals reflect the data stored in the CMOS cells.

When a memory cell is read, its bipolar signal converters function to convert the voltage levels in the conversion circuit, (referred to as the voltage mode differential signal of the stored data), to a differential current signal corresponding to the data, (referred to as the current mode differential signal of the stored data).

A read select circuit is coupled to each of the emitters of the bipolar signal converters for each memory cell. The read word select circuit comprises a bipolar select transistor and a current source. A read word select (RWS) control signal is coupled to the base of the select transistor. The RWS determines whether the current from the current source is allowed to flow through either of the two bipolar signal converters for a particular cell. When current is allowed to flow through the bipolar signal converters, the data for that cell is converted to a differential current signal (corresponding to the data stored in the storage cell) and coupled to complementary bit lines for the selected column. A current mode sense amplifier designed to detect differential currents senses the difference in current on the complementary bit lines. In response, the sense amplifier, outputs a corresponding differential voltage signal.

In an array of BiCMOS memory cells of the present invention, each memory cell has two bipolar signal converters having each of their bases coupled to one of the output nodes in the conversion circuit and having each of their collectors coupled to a complementary bit line. The emitters of the two bipolar signal converters for a particular cell are coupled to the collector of the cell's corresponding select transistor. The emitters of all of the select transistors in the same column are connected to a common current source. In addition, the array is arranged so that the bases of all of the select transistors in the same row are coupled to a common RWS line, such that when this RWS line is driven high, all of the data from one row of memory cells in the array is transferred to the bit lines and sensed by the sense amplifiers. The array is further arranged such that the collectors of all of the bipolar signal converters in the same column are coupled to a common bit line.

DETAILED DESCRIPTION

In the following description, a BiCMOS memory cell is described in which numerous specific details are set forth, such as specific voltage levels, device conductivity type etc., in order to provide a thorough understanding of the present invention. It will be obvious, however, to one skilled in the art that these specific details need not be employed to practice the present invention. In other instances, well-known structures and circuits have not been shown in detail in order to avoid unnecessarily obscuring the present invention.

Figure 3:
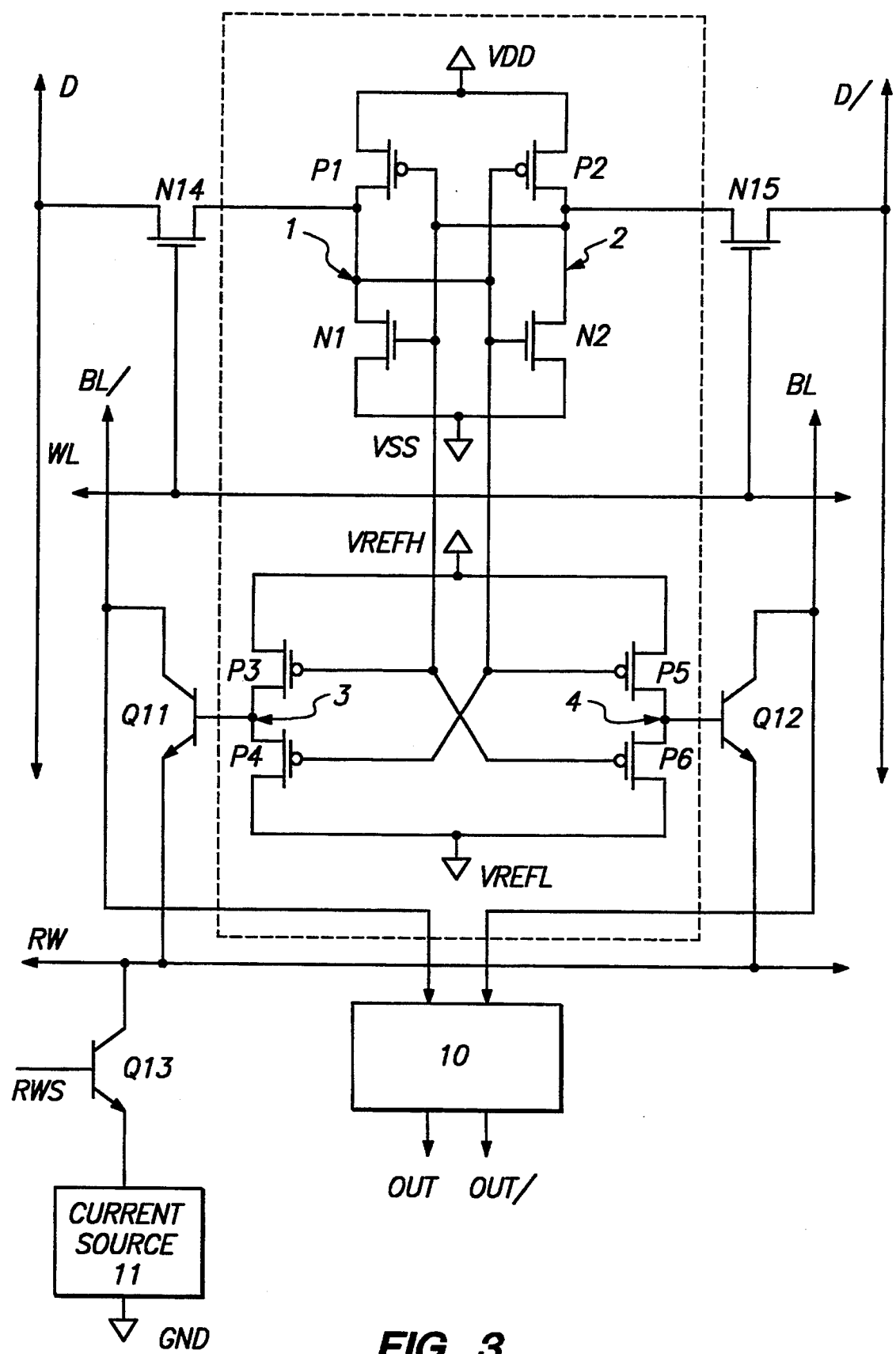
FIG. 3 is an embodiment of the BiCMOS memory cell of the present invention.

The present invention describes a current mode access BiCMOS memory cell. FIG. 3 shows the BiCMOS memory cell of the present invention. The storage cell portion of the memory cell is typical of most CMOS storage cells in that it includes two inverters having each of their inputs coupled to the others output. The first inverter includes MOS devices P1 and N1 and the second inverter includes devices P2 and N2. As can be seen in FIG. 3, the output of the first inverter, node 1, is coupled to the input of the second inverter. Further, the output of the second inverter, node 2, is coupled to the input of the first inverter. Also coupled to nodes 1 and 2 are NMOS write devices, N14 and N15.

Data is written into the storage cell by driving the write line (WL) high, thus turning on N14 and N15. When this occurs, the voltage potentials on data lines, D and D/, are transferred and stored on nodes 1 and 2. It should be obvious that when a voltage potential corresponding to a high logic level, VDD, is stored on node 1, a voltage potential corresponding to a low voltage, VSS, is stored on node 2. When the storage cell is in this condition, N2 and P1 are on and N1 and P2 are off. Conversely, when node 1 is low and node 2 is high, N2 and P1 are off and N1 and P2 are on.

In one embodiment of the present invention, the VDD of the storage cell is approximately equal to 5 volts, while VSS is equal to zero volts or ground. In another embodiment of the memory cell of the present invention, VDD is equal to 3 volts and VSS is equal to zero volts.

Figure 1:
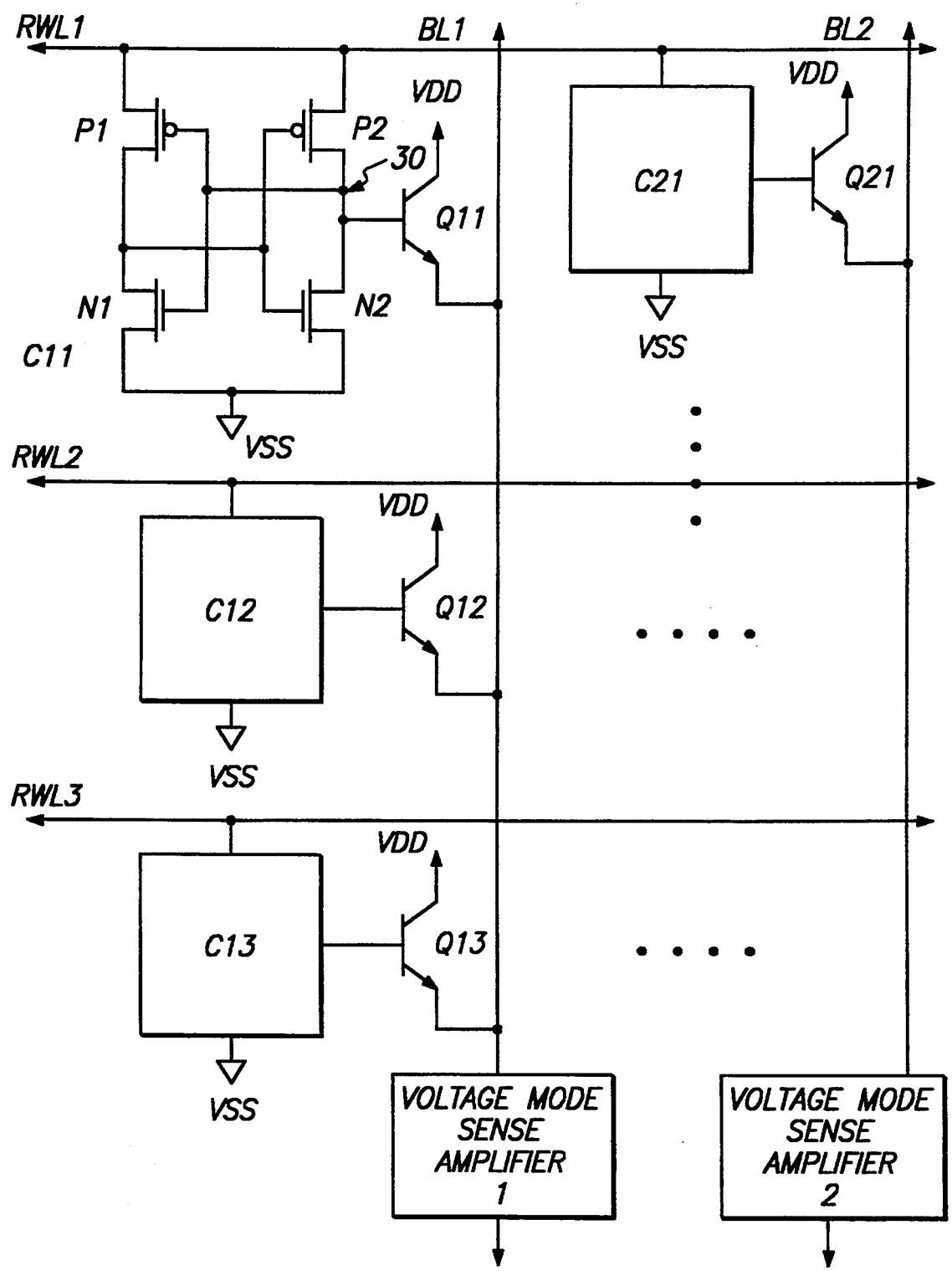
FIG. 1 is a prior art BiCMOS memory cell and array.
Figure 2:
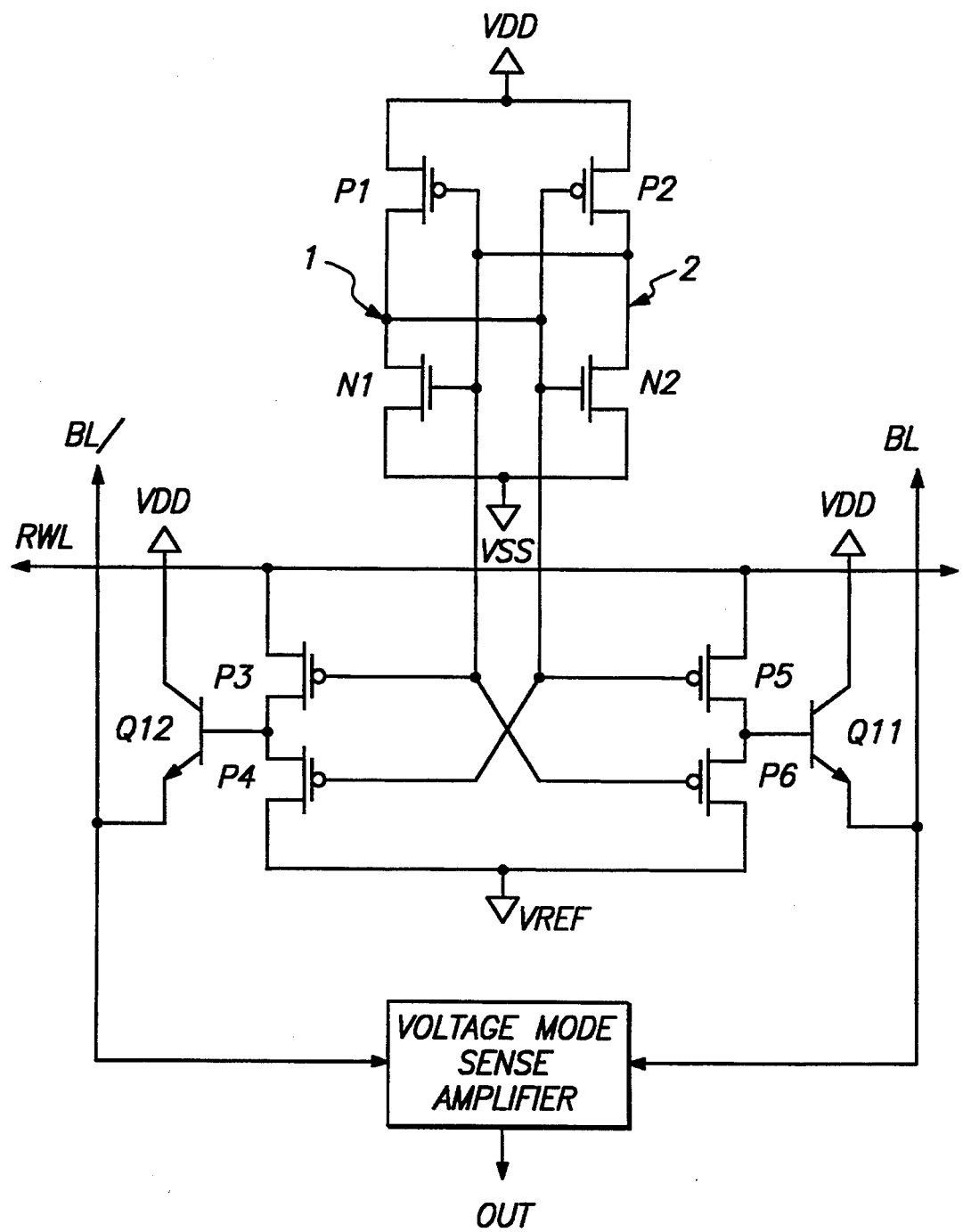
FIG. 2 is another prior art BiCMOS memory cell.

It should be noted that in both of the prior art memory cells shown in FIGS. 1 and 2, the RW line fluctuates. Fluctuating the RW line generates a certain amount of noise on the RW line that couples to other signal lines, such as VDD and ground. In both of the prior art memory cells shown in FIG. 1 and 2, this noise is tolerable if VDD is equal to 5 volts. However, if VDD is reduced to 3 volts in the memory cell shown in FIG. 1, the noise generated from the fluctuating RW line may cause the state of the cell to change. In the memory cell shown in FIG. 2, reducing VDD to 3 volts makes the noise generated from the fluctuations in the RW line much less tolerable because its associated sense amplifier and current source runs out of operating margin.

However, in the memory cell of the present invention, both the storage cell portion and the conversion portion are each coupled between two fixed voltage potentials. As a result, the present inventions memory cell is more robust because of the lack of noise generated from fluctuating the RW line. Consequently, the memory cell of present invention is able to function utilizing a VDD equal to 5 volts or a VDD equal to 3 volts without the adverse effects of a fluctuating RW line.

Referring to FIG. 3, the CMOS-to-ECL conversion portion of the BiCMOS memory cell is composed of P3–P6. As illustrated in FIG. 3, P3 and P4 are coupled in series between working potentials VREF(H) and VREF(L). Similarly, P5 and P6 are coupled in series between VREF(H) and VREF(L). The gates of P3 and P6 are coupled to node 2 and the gates of P5 and P4 are coupled to node 1.

The conversion circuit is responsive to the CMOS storage cell such that when node 1 is high, and node 2 is low, P5 and P4 are off and P3 and P6 are on. As a result, node 3 is at a voltage potential equal to VREF(H) and node 4 is at a voltage potential equal to VREF(L). Conversely, when node 1 is low, and node 2 is high, node 3 is at VREF(L) and node 4 is at VREF(H).

FIG. 3 shows, nodes 3 and 4 being coupled to the bases of bipolar signal converters Q11 and Q12, respectively. The collectors of Q11 and Q12 are coupled to a pair of differential bit lines and their emitters are coupled to a read word (RW) line. The RW line is also coupled to select transistor Q13 which controls whether current source 11 is coupled to RW.

As described above, when a high logic level is stored on node 1 and a low is stored on node 2, node 3 is at a voltage potential equal to VREF(H) and node 4 is at a voltage potential equal to VREF(L). This means that the base of Q11 is at a voltage potential equal to VREF(H) and the base of Q12 is at a voltage potential equal to VREF(L). Further, if RWS goes high then Q13 is turned on and current source 11 is coupled to the emitters of Q11 and Q12. When this occurs, the emitters of Q11 and Q12 are pulled low. Since the base of Q11 is at a higher potential than Q12, most of the current supplied by current source 11 flows through Q11 and the current flowing through Q12 is approximately equal to zero.

Since the collector of Q11 is coupled to BL/ and the collector of Q12 is coupled to BL, the current flowing through BL/ is approximately equal to the current supplied by current source 11 and the current flowing through BL is approximately equal to zero. Thus, a differential current is established in BL and BL/. This differential current signal is the current mode differential signal representing the data stored in the storage cell.

BL and BL/ are coupled to a differential current mode sense amplifier. Sense amplifier 10 detects the differential current mode signal on BL and BL/ and outputs a corresponding differential voltage mode signal on OUT and OUT/.

There are several factors that give the present invention's BiCMOS memory cell increased read speed. The first factor results from coupling the conversion circuit between VREF(H) and VREF(L) voltage potentials. In the preferred embodiment of the present invention, VREF(H) is approximately equal to $VDD - V_{DIODE\ DROP}$ and VREF(L) is equal to $VDD - 2 \times V_{DIODE\ DROP}$. VREF(H) and VREF(L) are chosen so as to ensure that Q11 and Q12 do not saturate. Saturating Q11 or Q12 can significantly delay read access times, since it is necessary to wait until the saturated bipolar signal converter comes out of saturation before it can change its state to reflect subsequent data. Thus, VREF(H) and VREF(L) are chosen to ensure that the base potential of bipolar signal converters Q11 and Q12 is never greater than the potential on their collectors. In other words, the conversion portion of the BiCMOS memory cell of the present invention functions to convert the CMOS voltage levels, i.e. VDD and VSS, to ECL adaptable voltage levels, i.e. VREF(H) and VREF(L).

In addition, since VREF(H) and VREF(L) are static levels, there is no delay associated with the resistance of the PMOS transistor (P3 or P5) that is coupling the data signal to the base of the bipolar signal converters (Q11 or Q12) and the capacitance at the base of the bipolar signal converters. Consequently there is no need to charge or discharge the output nodes of the conversion circuit during the read cycle. In this way, the speed of the circuit is enhanced. This is unlike the prior art memory cells shown in FIG. 2 in which the buffer circuit is coupled between variable voltage signal, RWL, and a fixed voltage level, VREF.

Another manner in which the present invention decreases read times is by reducing the voltage swing on BL and BL/. As mentioned above, BL and BL/ are typically high capacitance lines. As a result, the RC loading associated with BL and BL/ is also very high. Reducing the voltage swing on these high capacitance lines, also reduces read times.

Thus, instead of establishing a differential potential across the complementary bit lines such that large voltage differences are detected by a voltage mode sense amplifier, the present invention establishes a differential current in the bit lines. The differential current signal has a relatively low peak-to-peak voltage. Low peak-to-peak voltages on BL and BL/ reduce the impact of capacitive loading and consequently memory cell read times are reduced.

Read times may be further reduced by utilizing a current mode sense amplifier (or a current mode receiver) that clamps the peak-to-peak voltage of the differential current mode signals even lower by virtue of its low input impedance. In the patent application entitled "BiCMOS Current Mode Driver and Receiver" assigned to the assignee of the present invention, a current mode receiver is disclosed in which differential interconnect lines are clamped to a peak-to-peak voltage much less than prior art current mode sense amplifiers. Thus, read times for the memory cell of the present invention may be greatly enhanced if it is utilized in conjunction with this type of receiver. However, it is to be understood, that the present invention may be utilized with any current mode differential-type sense amplifier.

Figure 4:
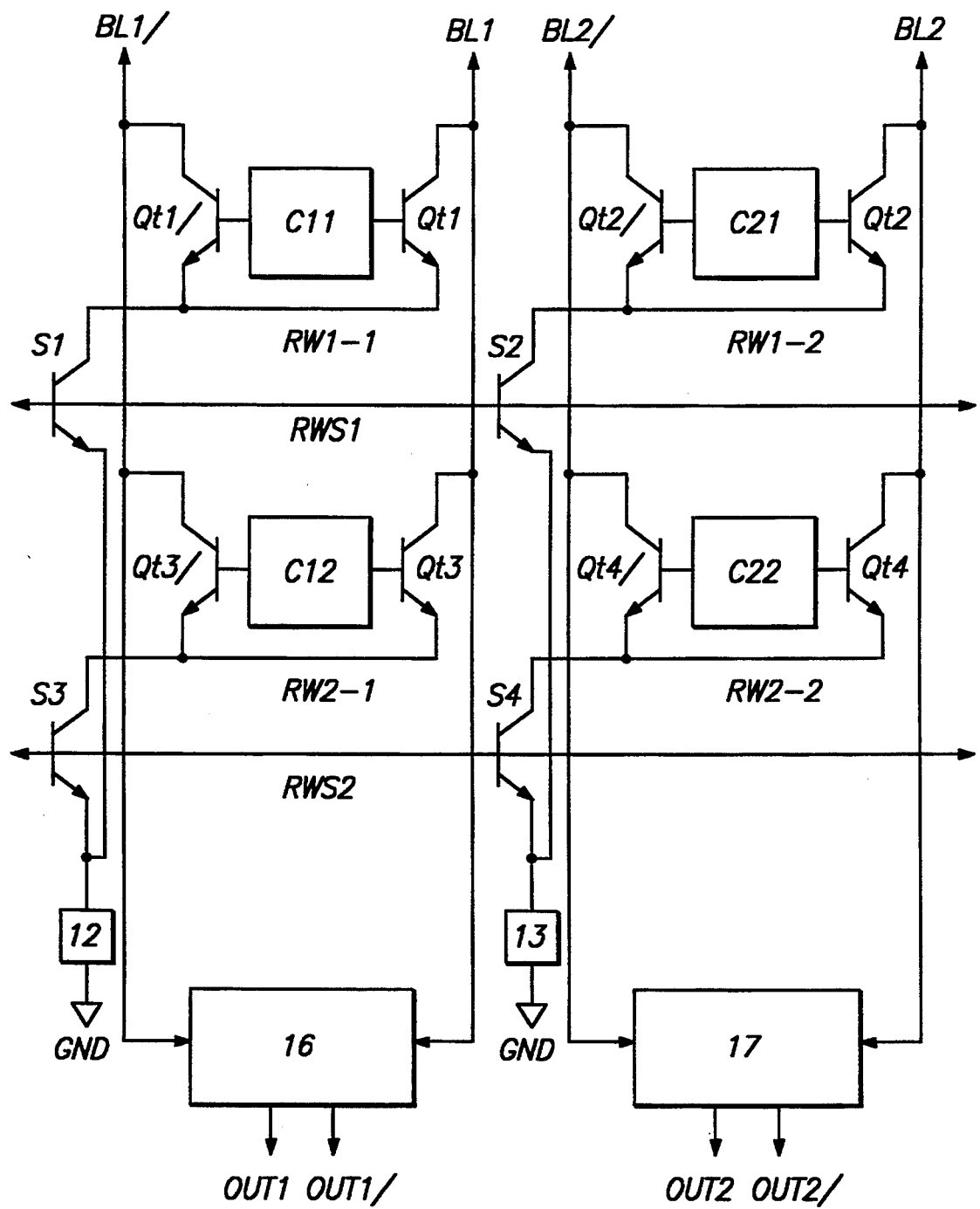
FIG. 4 is an embodiment of the BiCMOS memory array of the present invention.

FIG. 4 shows an array of BiCMOS memory cells of the present invention. The cells are numbered such that the first number following the "C" designates the column it is in and its second number designates the row it is in. For example, cell C11 is in the first column and the first row and C12 is in the first column and the second row, etc.

Each cell shown in FIG. 4 includes a storage portion and a conversion portion such as that shown in the dashed line area shown in FIG. 3. In other words, C11, C12, C21 and C22 all include P1–P6, N1 and N2 (FIG. 3). Referring to FIG. 4, each of the cells are coupled to a pair of bipolar signal converters Qt/ and Qt which correspond to the bipolar signal converters, Q11 and Q12, shown in FIG. 3.

Write transistors N14 and N15, (shown in FIG. 3), are not shown in the array of BiCMOS memory cells illustrated in FIG. 4 so as to simplify the explanation of the BiCMOS memory cell array of the present invention. However, it is to be understood that each of the memory cells also includes two write transistors. The gates of each of the write transistors in the same row are coupled to the same WL in such a manner so that a word of data may be written into a row (or a portion of a row) of cells when the WL is driven high.

The collectors of the bipolar signal converters Qt1, Qt1/, Qt3, and Qt3/ for the cells in column 1 are all coupled to BL1 and BL1/. Similarly, the collectors of the bipolar signal converters Qt2, Qt2/, Qt4, and Qt4/ for the cells in column 2 are coupled to BL2 and BL2/. Further, the emitters of each set of bipolar signal converters are coupled to the same word line. For example, the emitters of each of Qt1, Qt1/ are coupled to RW1-1, the emitters of Qt2, and Qt2/ are coupled to RW1-2 and the emitters of Qt3, Qt3/ are coupled to RW2-1, the emitters of Qt4, and Qt4/ are coupled to RW2-2.

Each cell has its own corresponding select transistor coupled to its corresponding RW. As can be seen in FIG. 4, the collectors of S1 and S2 are coupled to RW1-1 and RW1-2, respectively. Similarly, the collectors of S3 and S4 are coupled to RW2-1 and RW2-2, respectively. It should also be noted that the RW lines for each row of cells are not continuous signal lines coupling all of the cells together, i.e. RW1-1 and RW1-2 are not coupled together. However, in another embodiment of the present invention, S2 and S4 may be eliminated such that S1 selects both C11 and C21 and S3 selects C12 and C22. In this particular embodiment the RW line for each row of cells is a continuous signal line coupling all of the cells together.

For the embodiment shown in FIG. 4, one current source is coupled to the emitters of the select transistors in the same column. Referring to FIG. 4, current source 12 is coupled to the emitters of each of S1 and S3 and current source 13 is coupled to the emitters of each of S2 and S4.

The array functions such that only one RWS line is driven high at a time, i.e. only one row is read at a time. Thus, if RWS1 is high, then RWS2 is low. When RWS2 is low, select transistors S3 and S4 are off and no current flows through either of bipolar signal converters Qt3, Qt3/, Qt4, or Qt4/. However, when RWS1 is high, S1 and S2 are on. Consequently, current source 12 is coupled to the emitters of Qt1/ and Qt1 and current source 13 is coupled to the emitters of Qt2/ and Qt2. When this occurs, the current from each of the current sources is driven through either of the two complementary bipolar signal converters, (depending on which of the complementary bipolar signal converters is on).

For example if the base of Qt1 is high and the base of Qt1/ is low, then most of the current from current source 12 is routed through Qt1 and a relatively small amount of current flows through Qt1/. Since the collectors of Qt1 and Qt1/ are coupled to BL1 and BL1/, most of the current from current source 12 is routed through BL1 and a relatively small amount of current flows through BL1/. Thus, a differential current is established in BL1 and BL1/. This differential current is detected by current sense amplifier 16 and converted to a differential voltage at OUT1 and OUT1/ corresponding to the data stored in C11.

Similarly, if the base of Qt2 is high and the base of Qt2/ is low, then most of the current from current source 13 is routed through Qt2 and a relatively small amount of current flows through Qt2/. Since the collectors of Qt2 and Qt2/ are coupled to BL2 and BL2/, most of the current from current source 13 is routed through BL2 and a relatively small amount of current flows through BL2/. Thus, a differential current is established in BL2 and BL2/. This differential current is detected by current sense amplifier 17 and converted to a differential voltage at OUT2 and OUT2/ corresponding to the data stored in C21.

As a result, the word of data stored in cells C11 and C21 is output by current mode sense amplifiers 16 and 17 when RWS1 is high and RWS2 is low.

Similar to the above described read operation, if RWS1 is low and RWS2 is high, then the data from C12 and C22 is coupled onto the bit lines through Qt3 and Qt3/ and Qt4 and Qt4/.

Although the present invention has been described in conjunction with certain embodiments, it is appreciated that the invention may be implemented in a variety of other ways. By way of example, the concept of the present invention is not strictly limited to a BiCMOS circuit; it can be implemented with any two types of logic designs. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

Thus, the present invention is an improved BiCMOS memory cell that is read by utilizing current accessing techniques.

We claim:

1. A semiconductor memory cell for storing data, said data corresponding to first and second logic levels, said data in said memory cell being sensed by a differential current sensing apparatus, said memory cell comprising:
   a means for storing first and second voltage potentials, said first and second voltage potentials corresponding to said first and second logic levels;
   a first means for converting said first voltage potential into a third voltage potential and said second voltage potential into a fourth voltage potential, said first means for converting being coupled between said third and fourth voltage potentials;
   a second means for convening said third and fourth voltage potentials into differential current mode signal corresponding to said data, said differential current mode signal having an associated peak-to-peak voltage, said second converting means being coupled to first and second sensing nodes;
   a current driving means for supplying a current driving signal to said second convening means, said current driving means being responsive to a read signal;
   wherein, in response to said read signal said current driving signal is coupled to said second convening means, said second converting means in response to said current driving signal converting said third and fourth voltage potentials into said differential current mode signal corresponding to said data;
   wherein said differential current sensing apparatus detects said differential current mode signal corresponding to said data on said first and second sensing nodes and outputs a corresponding differential voltage mode signal.

2. The memory cell as described in claim 1 wherein said first and second voltage potentials correspond to a first type of logic voltage potentials and said third and fourth voltage potentials correspond to a second type of logic voltage potentials.

3. The memory cell as described in claim 2 wherein said differential current sensing apparatus clamps said peak-to-peak voltage of said differential current mode signal corresponding to said data such that capacitive loading effects are minimized when said memory cell is being mad.

4. The memory cell as described in claim 3 also including a means for writing data into said means for storing.

5. The memory cell as described in claim 4 wherein said first voltage potential is approximately equal to 3 volts and said second voltage potential is approximately equal to zero volts.

6. A BiCMOS memory cell for storing data, said data corresponding to first and second logic levels, said data being sensed by a differential current sensing apparatus, said memory cell comprising:
   a means for storing first and second CMOS voltage potentials corresponding to said data, said first and second CMOS voltage potentials corresponding to said first and second logic levels;
   a first means for converting said first CMOS voltage potential into a third voltage potential and said second CMOS voltage potential into a fourth voltage potential, said third and fourth voltage potential corresponding to ECL voltage potentials, said first means for converting being coupled between said third and fourth voltage potentials;
   a second means for converting said third and fourth voltage potentials into differential current mode signal corresponding to said dam, said differential current mode signal having an associated peak-to-peak voltage, said second converting means comprising first and second bipolar transistors, said second converting means being coupled to first and second sensing nodes;

a current driving means for supplying a current driving signal to said second converting means, said current driving means being responsive to a mad signal;

wherein, in response to said read signal said current driving signal is coupled to said second converting means, said second converting means in response to said current driving signal converting said third and fourth voltage potentials into said differential current mode signal corresponding to said data;

wherein said differential current sensing apparatus detects said differential current mode signal corresponding to said data on said first and second sensing nodes and outputs a corresponding differential voltage mode signal.

7. The BiCMOS memory cell as described in claim 6 wherein said first converting means comprises first and second PMOS devices coupled in series at a first common node between said third and fourth voltage potentials, said first PMOS device having its source coupled to said third voltage potential and said second PMOS device having its drain coupled to said fourth voltage potential, said first converting means also including third and fourth PMOS devices coupled in series at a second common node between said third and fourth voltage potentials, said third PMOS device having its source coupled to said third voltage potentials and said fourth PMOS device having its drain coupled to said fourth voltage potential, the gates of said first and fourth PMOS devices being coupled together and the gates of said second and third PMOS devices being coupled together, said first common node between said first and second PMOS devices being coupled to the base of one of said first and second bipolar transistors and said second common node between said third and fourth PMOS devices being coupled to the base of the other of said first and second bipolar transistors.

8. The BiCMOS memory cell as described in claim 7 wherein said means for storing includes first and second CMOS inverters each being coupled between said first and second voltage potentials, said first CMOS inverter having an input and an output and said second CMOS inverter having an input and an output, said first CMOS inverter having its input coupled to said output of said second CMOS inverter and said second CMOS inverter having its input coupled to said output of said first CMOS inverter.

9. The BiCMOS memory cell as described in claim 8 wherein said differential current sensing apparatus clamps said peak-to-peak voltage of said differential current mode signal corresponding to said data such that capacitive loading effects are minimized when said memory cell is being read.

10. The BiCMOS memory cell as described in claim 9 also including a means for writing data into said means for storing.

11. The BiCMOS memory cell as described in claim 10 wherein said first voltage potential is approximately equal to 3 volts and said second voltage potential is approximately equal to zero volts.

12. The BiCMOS memory cell as described in claim 10 wherein said first voltage potential is approximately equal to 5 volts, said second voltage potential is approximately equal to zero volts, said third voltage potential is approximately equal to said first voltage potential minus a $V_{DIODE\ DROP}$, where a $V_{DIODE\ DROP}$ is equal to the forward bias voltage drop across a diode junction, and said fourth voltage potential is approximately equal to said first voltage potential minus ($2 \times V_{DIODE\ DROP}$).

* * * * *